United States Patent
Kang

(10) Patent No.: US 7,936,632 B2
(45) Date of Patent: May 3, 2011

(54) SEMICONDUCTOR DEVICE INCLUDING AN INTERNAL CIRCUIT RECEIVING TWO DIFFERENT POWER SUPPLY SOURCES

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 10 days.

(21) Appl. No.: 12/493,976

(22) Filed: Jun. 29, 2009

(65) Prior Publication Data

US 2010/0074043 A1     Mar. 25, 2010

(30) Foreign Application Priority Data

Sep. 19, 2008   (KR) .................. 10-2008-0092238
Jun. 17, 2009   (KR) .................. 10-2009-0053799

(51) Int. Cl.
   *G11C 5/14*   (2006.01)
(52) U.S. Cl. ............. 365/226; 365/189.9; 327/530; 327/538
(58) Field of Classification Search ............ 365/226
   See application file for complete search history.

(56) References Cited

U.S. PATENT DOCUMENTS

| | | | | |
|---|---|---|---|---|
| 5,789,808 | A * | 8/1998 | Yamasaki et al. | 257/693 |
| 5,875,145 | A * | 2/1999 | Yamasaki et al. | 365/226 |
| 5,914,505 | A * | 6/1999 | Hisada et al. | 257/207 |
| 6,249,462 | B1 * | 6/2001 | Tanaka et al. | 365/189.05 |
| 6,483,357 | B2 * | 11/2002 | Kato et al. | 327/143 |
| 6,492,863 | B2 * | 12/2002 | Kono et al. | 327/538 |
| 6,603,685 | B2 * | 8/2003 | Hidaka et al. | 365/189.11 |
| 7,102,413 | B2 * | 9/2006 | Kuroda | 327/408 |
| 7,200,054 | B2 * | 4/2007 | Horiguchi et al. | 365/189.11 |
| 7,221,206 | B2 * | 5/2007 | Misawa et al. | 327/291 |
| 7,492,645 | B2 | 2/2009 | Kang et al. | |
| 7,492,646 | B2 | 2/2009 | Lee et al. | |
| 7,558,128 | B2 * | 7/2009 | Shin et al. | 365/189.09 |

FOREIGN PATENT DOCUMENTS

| | | |
|---|---|---|
| JP | 10-079191 | 3/1998 |
| JP | 2003-196979 | 7/2003 |
| KR | 1020060135367 | 12/2006 |

OTHER PUBLICATIONS

Notice of Preliminary Rejection issued from Korean Intellectual Property Office on Sep. 29, 2010.

* cited by examiner

Primary Examiner — Son L Mai
(74) Attorney, Agent, or Firm — IP & T Group LLP

(57) ABSTRACT

A semiconductor device includes an internal circuit configured to receive a first power supply voltage applied via a first power input terminal through a first power supply path and receive an internal power supply voltage to perform a predetermined circuit operation and an internal power supply voltage generator configured to receive a second power supply voltage for a power circuit applied via a second power input terminal through a second power supply path and generate the internal power supply voltage, wherein the second power supply path is separated from the first power supply path.

16 Claims, 2 Drawing Sheets

SEMICONDUCTOR DEVICE INCLUDING AN INTERNAL CIRCUIT RECEIVING TWO DIFFERENT POWER SUPPLY SOURCES

CROSS-REFERENCES TO RELATED APPLICATIONS

The present application claims priority of a Korean patent application Nos. 10-2008-0092238 and 10-2009-0053799, filed on Sep. 19, 2008 and Jun. 17, 2009, respectively, the contents of which are incorporated herein by reference.

BACKGROUND OF THE INVENTION

The present invention relates to a semiconductor design technology, and more particularly, to a semiconductor device which performs a variety of circuit operations by using a power supply voltage applied thereto from outside.

Generally, with an increasing high integration of semiconductor devices such as double data rate synchronous dynamic random access memory (DDR SDRAM), they adopt a design rule below a sub-micron level in design of internal circuits. In order for these hyperfine-structured circuits to operate at high operation frequency, it is required that the semiconductor memory devices basically use a power supply voltage with a very low level. The semiconductor device receives such power supply voltage from the outside and performs various circuit operations by using it.

To be more specific, the semiconductor device receives a power supply voltage from the outside and processes it internally to generate an internal power supply voltage. Examples of the internal power supply voltage include a core voltage and a peripheral (peri) voltage which are obtained by down-converting the power supply voltage from the outside, and a pumping voltage and a substrate bias voltage which are derived by pumping the power supply voltage, and so on.

FIG. 1 is a block diagram for schematically explaining a partial circuit of a conventional semiconductor device.

Referring to FIG. 1, the conventional semiconductor device includes an internal circuit 110 and an internal power supply voltage generator 130.

The internal circuit 110 receives a power supply voltage VDD provided from the outside, a ground voltage VSS, a power supply voltage data output VDDQ, a ground voltage for data output VSSQ, a command signal CMD, an address signal ADD, and data DAT via input terminals such as pad, ball, pin or the like, and performs read and write operations. More specifically, the internal circuit 110 generates a control signal CTR for controlling the internal power supply voltage generator 130, by using an internal power supply voltage V_INT which is generated by the internal power supply voltage generator 130 and applied thereto.

The internal power supply voltage generator 130 generates the internal power supply voltage V_INT in response to the power supply voltage VDD from the outside, the ground voltage VSS, and the control signal CTR. Here, the internal power supply voltage V_INT should always have a stable voltage level kept, which is essentially required under the situation that the voltage level used for the semiconductor device is gradually lowered in recent years.

Meanwhile, in the conventional semiconductor device, the internal circuit 110 and the internal power supply voltage generator 130 receive the power supply voltage VDD and the ground voltage VSS via the same input terminals. In this structure, the internal power supply voltage V_INT may have noise reflected therein depending on operations of the internal circuit 110, which will be discussed below with reference to FIG. 2.

FIG. 2 shows waveforms for explaining variations of each power supply voltage and each ground voltage that are caused by circuit operations of the conventional semiconductor device, in which the power supply voltage VDD, the internal power supply voltage V_INT and the ground voltage VSS are depicted. For convenience of explanation, it is illustrated that the internal power supply voltage V_INT is generated by down-converting the power supply voltage VDD.

Referring to FIGS. 1 and 2, the power supply voltage VDD, the internal power supply voltage V_INT and the ground voltage VSS all have the stable state without noise before an active command ACT is not applied to the semiconductor device.

However, when the active command ACT is applied, the internal circuit 110 performs a circuit operation, in which the power supply voltage VDD abruptly fluctuates. This is because the internal circuit 110 uses a current of the power supply voltage VDD. Since the current used is discharged into the ground voltage VSS, the ground voltage VSS abruptly fluctuates. That is, noises occur in the power supply voltage VDD and the ground voltage VSS.

The power supply voltage VDD and the ground voltage VSS with noises are applied to the internal power supply voltage generator 130. Thus, the internal power supply voltage V_INT generated by the internal power supply voltage generator 130 fluctuates due to noises in the power supply voltage VDD and the ground voltage VSS. That is, noises also occur in the internal power supply voltage V_INT. As mentioned above, the reason why noises occur in the internal power supply voltage V_INT is that the internal circuit 110 and the internal power supply voltage generator 130 receive the power supply voltage VDD and the ground voltage VSS via the same input terminals. In other words, the circuit operation of the internal circuit 110 affects the internal power supply voltage generator 130 through the common input terminals, which in turn makes noises reflected in the internal power supply voltage V_INT.

As described above, the conventional semiconductor device has the structure that, during the circuit operation of the internal circuit 110, reflects noises in the internal power supply voltage V_INT. The internal power supply voltage V_INT with noises cannot guarantee the stable operation of the semiconductor device, which causes a malfunctioning therein.

SUMMARY OF THE INVENTION

An embodiment of the present invention is directed to provide a semiconductor device which can receive a power supply voltage from the outside via separate input terminals and transfer it to corresponding circuits via separate power supply paths.

In accordance with an aspect of the present invention, there is provided a semiconductor device comprising an internal circuit configured to receive a first power supply voltage applied via a first power input terminal through a first power supply path and receive an internal power supply voltage to perform a predetermined circuit operation and an internal power supply voltage generator configured to receive a second power supply voltage for a power circuit applied via a second power input terminal through a second power supply path and generate the internal power supply voltage, wherein the second power supply path is separated from the first power supply path.

In accordance with a further another aspect of the present invention, there is provided a semiconductor device comprising an internal circuit configured to receive a first power supply voltage and a first ground voltage applied via a first power input terminal through a first power supply path and receive an internal power supply voltage to perform a predetermined circuit operation, wherein the first power input terminal comprises a first input terminal that inputs the first power supply voltage and a second input terminal that inputs the first ground voltage and an internal power supply voltage generator configured to receive a second power supply voltage and a second ground voltage for a power circuit applied via a second power input terminal through a second power supply path to generate the internal power supply voltage, wherein the second power input terminal comprises a third input terminal that inputs the second power supply voltage and a fourth input terminal that inputs the second ground voltage.

In accordance with a further another aspect of the present invention, there is provided a semiconductor device comprising an internal circuit configured to receive a first power supply voltage and a first ground voltage applied via a first power input terminal through a first power supply path and receive an internal power supply voltage to perform a predetermined circuit operation and an internal power supply voltage generator configured to receive a second power supply voltage and a second ground voltage for a power circuit applied via a second power input terminal through a second power supply path to generate the internal power supply voltage.

BRIEF DESCRIPTION OF THE DRAWINGS

Features of the present invention will become apparent to those skilled in the art from the following description with reference to the figures, in which.

DESCRIPTION OF SPECIFIC EMBODIMENTS

Other objects and advantages of the present invention can be understood by the following description, and become apparent with reference to the embodiments of the present invention.

Hereinafter, the most preferred embodiment of the present invention will be described in detail with reference to the accompanying drawings so that the invention can be easily carried out by those skilled in the art to which the invention pertains.

Figure 1:
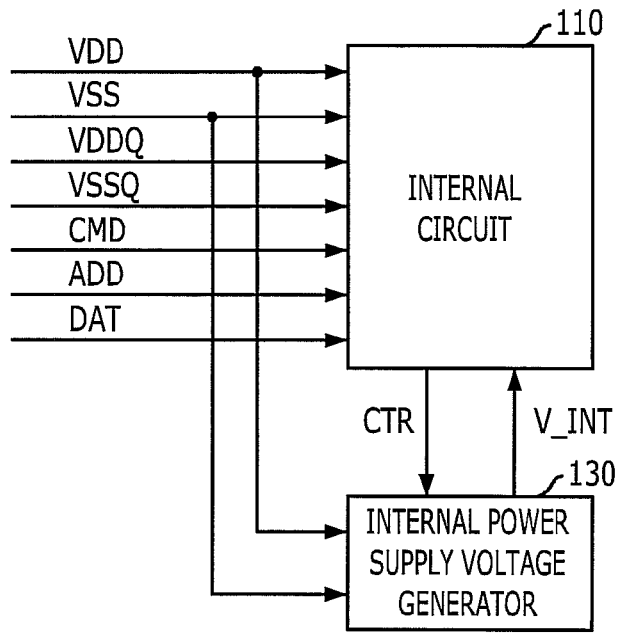
FIG. 1 is a block diagram for schematically explaining a partial circuit of a conventional semiconductor device.
Figure 2:
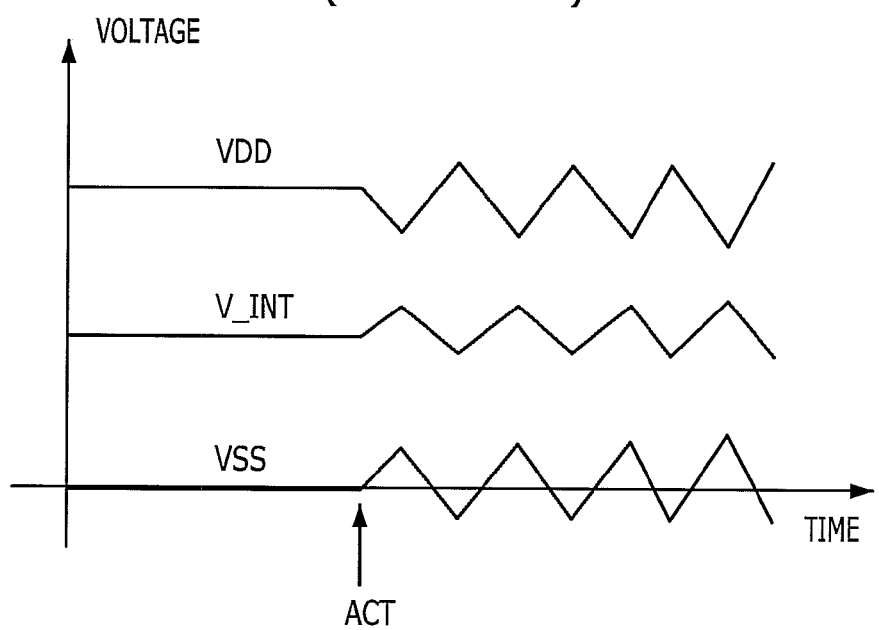
FIG. 2 shows waveforms for explaining variations of each power supply voltage and each ground voltage that are caused by circuit operations of the conventional semiconductor device in FIG. 1.
Figure 3:
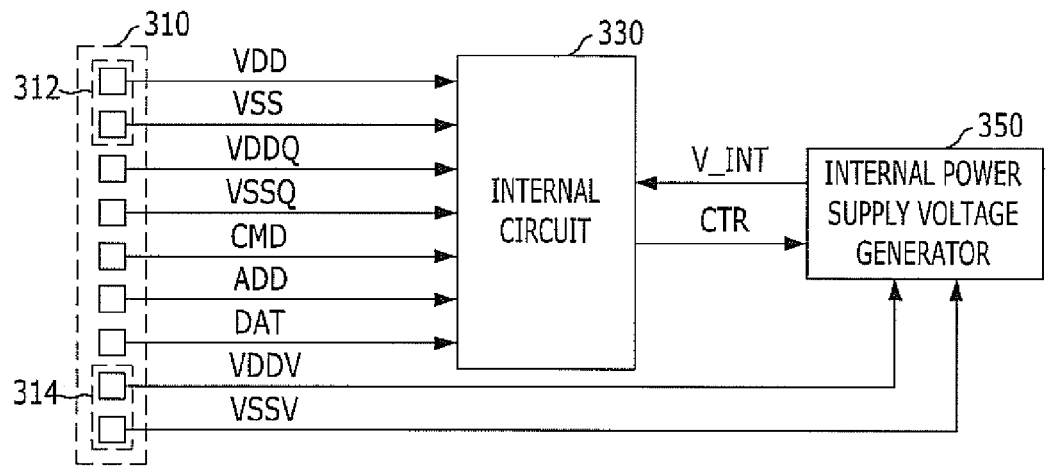
FIG. 3 illustrates a block diagram of a partial circuit of a semiconductor device in accordance with an embodiment of the present invention.

FIG. 3 illustrates a block diagram of a partial circuit of a semiconductor device in accordance with an embodiment of the present invention.

Referring to FIG. 3, the semiconductor device of the present invention includes a plurality of input terminals 310, an internal circuit 330, and an internal power supply voltage generator 350.

The plurality of input terminals 310 are for receiving a power supply voltage VDD for the internal circuit from the outside, a ground voltage VSS for an internal circuit, a power supply voltage VDDQ for data output, a ground voltage VSSQ for data output, a command signal CMD, an address signal ADD, data DAT, a power supply voltage VDDV for a power circuit, and a ground voltage VSSV for a power supply. These input terminals 310 indicate input terminals such as a pad, a ball, a pin or the like.

The semiconductor device in accordance with the present invention is configured to receive the power supply voltage VDD and the ground voltage VSS applied to the internal circuit 330, and the power supply voltage VDDV and the ground voltage VSSV applied to the internal power supply voltage generator 350 via input terminals that are designed separately from each other, and to deliver them to corresponding circuits via different power supply paths. Therefore, the plurality of input terminals 310 are provided with a first power input terminal 312 for receiving the power supply voltage VDD and the ground voltage VSS applied to the internal circuit 330, and a second power input terminal 314 for receiving the power supply voltage VDDV for the power circuit and the ground voltage VSSV for the power circuit applied to the internal power supply voltage generator 350.

The internal circuit 330 receives the power supply voltage VDD for the internal circuit, the ground voltage VSS for the internal circuit, the power supply voltage VDDQ for data output, the ground voltage VSSQ for data output, the command signal CMD, the address signal ADD, and the data DAT via the plurality of input terminals 310, and performs read and write operations. More specifically, the internal circuit 330 generates a control signal CTR for controlling the internal power supply voltage generator 350 by using an internal power supply voltage V_INT, which is generated by the internal power supply voltage generator 350 and applied thereto.

The internal power supply voltage generator 350 generates the internal power supply voltage V_INT in response to the power supply voltage VDDV for the power circuit, the ground voltage VSSV for the power circuit received through the second power input terminal 314 of the plurality of input terminals 310, and the control signal CTR.

As it can be seen from FIG. 3, the power supply path of the power supply voltage VDD for the internal circuit and the ground voltage VSS for the internal circuit received through the first power input terminal 312 is different from that of the power supply voltage VDDV for the power circuit and the ground voltage VSSV for the power circuit received through the second power input terminal 314. The power supply path of the power supply voltage VDD and the ground voltage VSS and the power supply path of the power supply voltage VDDV and the ground voltage VSSV are separated from each other.

As described above, the semiconductor device in accordance with the present invention has the structure in which the power input terminals and the power supply paths are configured separately. Thus, although noises occur in the power supply voltage VDD for the internal circuit and the ground voltage VSS for the internal circuit due to the circuit operation of the internal circuit 330, the internal power supply voltage V_INT can be generated stably by using the separate power supply voltage VDDV for the power circuit and the separate ground voltage VSSV for the power circuit.

Figure 4:
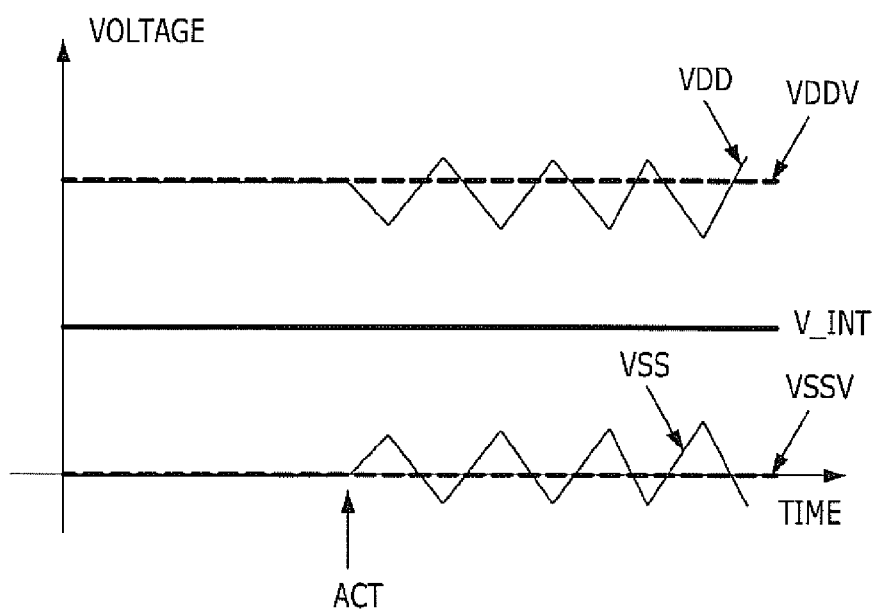
FIG. 4 shows waveforms for explaining voltage variations of each power supply voltage and each ground voltage that are caused by circuit operations of the semiconductor device in FIG. 3.

FIG. 4 shows waveforms for explaining variations of each power supply voltage and each ground voltage that are caused by circuit operations of the semiconductor device in FIG. 3, in which the power supply voltage VDD for the internal circuit, the power supply voltage VDDV for the power circuit, the internal power supply voltage V_INT, the ground voltage VSS for the internal circuit, and the ground voltage VSSV for the power circuit are shown. For convenience of explanation, it is illustrated that the internal power supply voltage V_INT is generated by down-converting the power supply voltage VDD.

Referring to FIGS. 3 and 4, the power supply voltage VDD for the internal circuit and the power supply voltage VDDV for the power circuit have the stable state with the same voltage level, and the ground voltage VSS for the internal circuit, and the ground voltage VSSV for the power circuit have the stable state with the same voltage level before an active command ACT is applied to the semiconductor device. Also, the internal power voltage V_INT has the stable state before the active command ACT is not thereto.

Then, when the active command ACT is applied, the internal circuit 330 performs a circuit operation. Thus, the power supply voltage VDD for the internal circuit and the ground voltage VSS for the internal circuit abruptly fluctuate. However, it can be seen that the power supply voltage VDDV for the power circuit and the ground voltage VSSV for the power circuit still keep the stable state. This is because the semiconductor device in accordance with the present invention receives the power supply voltage VDDV for the power circuit and the ground voltage VSSV for the power circuit via the second power input terminal 314 which is designed separately from the first power input terminal 312 to which the power supply voltage VDD for the internal circuit and the ground voltage VSS for the internal circuit are applied. Thus, although noises occur in the power supply voltage VDD for the internal circuit and the ground voltage VSS for the internal circuit, no noise takes place in the power supply voltage VDDV for the power circuit and the ground voltage VSSV for the power circuit.

As a result, the internal power supply voltage generator 350 receives the power supply voltage VDDV for the power circuit and the ground voltage VSSV for the power circuit with no noise, based on which it can generate the internal power supply voltage V_INT with a stable voltage level.

As described above, the present invention can always generate a stable internal power supply voltage, regardless of circuit operations, by making sure that noises in a power supply voltage occurred by circuit operations of the internal circuit have no influence on the generation of the internal power supply voltage. In addition, the present invention can improve reliability of the semiconductor device based on the generation of the stable internal power supply voltage.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    an internal circuit configured to receive a first power supply voltage applied via a first power input terminal through a first power supply path and receive an internal power supply voltage to perform a predetermined circuit operation; and
    an internal power supply voltage generator configured to receive a second power supply voltage for a power circuit applied via a second power input terminal through a second power supply path and generate the internal power supply voltage using a control signal from the internal circuit,
    wherein the second power supply path is separated from the first power supply path.

2. The semiconductor device of claim 1, wherein the first power input terminal and the second power input terminal are selected from the group consisting of pads, balls and pins, and the pads, the balls and the pins are designed separately from each other.

3. The semiconductor device of claim 1, wherein the first power supply voltage and the second power supply voltage have the same voltage level.

4. The semiconductor device of claim 1, wherein the internal circuit performs circuit operations using a command signal, an address signal and data.

5. The semiconductor device of claim 1, wherein the first power input terminal comprises a first input terminal that inputs the first power supply voltage for the internal circuit and a second input terminal that inputs a ground voltage for the internal circuit.

6. The semiconductor device of claim 1, wherein the second power input terminal comprises a first input terminal that inputs the second power supply voltage for the power circuit and a second input terminal that inputs a ground voltage for the power circuit.

7. A semiconductor device, comprising:
    an internal circuit configured to receive a first power supply voltage and a first ground voltage applied via a first power input terminal through a first power supply path and receive an internal power supply voltage to perform a predetermined circuit operation, wherein the first power input terminal comprises a first input terminal that inputs the first power supply voltage and a second input terminal that inputs the first ground voltage; and
    an internal power supply voltage generator configured to receive a second power supply voltage and a second ground voltage for a power circuit applied via a second power input terminal through a second power supply path to generate the internal power supply voltage using a control signal from the internal circuit,
    wherein the second power input terminal comprises a third input terminal that inputs the second power supply voltage and a fourth input terminal that inputs the second ground voltage.

8. The semiconductor device of claim 7, wherein the second power supply path is separated from the first power supply path.

9. The semiconductor device of claim 7, wherein the first power supply voltage and the second power supply voltage have the same voltage level.

10. The semiconductor device of claim 7, wherein the internal circuit performs circuit operations using a command signal, an address signal and data.

11. A semiconductor device, comprising:
    an internal circuit configured to receive a first power supply voltage and a first ground voltage applied via a first power input terminal through a first power supply path and receive an internal power supply voltage to perform a predetermined circuit operation; and
    an internal power supply voltage generator configured to receive a second power supply voltage and a second ground voltage for a power circuit applied via a second power input terminal through a second power supply path to generate the internal power supply voltage using a control signal from the internal circuit.

12. The semiconductor device of claim 11, wherein the second power supply path is separated from the first power supply path.

13. The semiconductor device of claim 12, wherein the first power input terminal comprises a first input terminal that inputs the first power supply voltage for the internal circuit and a second input terminal that inputs the first ground voltage for the internal circuit.

14. The semiconductor device of claim 12, wherein the second power input terminal comprises a first input terminal that inputs the second power supply voltage for the power circuit and a second input terminal that inputs the second ground voltage for the power circuit.

15. The semiconductor device of claim 11, wherein the first power supply voltage and the second power supply voltage have the same voltage level.

16. The semiconductor device of claim 11, wherein the internal circuit performs circuit operations using a command signal, an address signal and data.

* * * * *